(12) United States Patent
Otoguro et al.

(10) Patent No.: US 6,887,649 B2
(45) Date of Patent: May 3, 2005

(54) MULTI-LAYERED RESIST STRUCTURE AND MANUFACTURING METHOD OF SEMICONDUCTOR DEVICE

(75) Inventors: Akihiko Otoguro, Kawasaki (JP); Satoshi Takechi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 307 days.

(21) Appl. No.: 10/092,310

(22) Filed: Mar. 7, 2002

(65) Prior Publication Data

US 2002/0192595 A1 Dec. 19, 2002

(30) Foreign Application Priority Data

Jun. 14, 2001 (JP) ....................................... 2001-180584

(51) Int. Cl.[7] .............................................. G03F 7/004
(52) U.S. Cl. ............................... 430/272.1; 430/270.1; 430/271.1; 430/273.1; 430/313; 430/316; 430/945
(58) Field of Search ...................... 430/272.1, 313, 430/316, 945, 273.1, 271.1

(56) References Cited

U.S. PATENT DOCUMENTS

| | | | | |
|---|---|---|---|---|
| 4,820,788 A | * | 4/1989 | Zeigler | 528/33 |
| 4,891,303 A | * | 1/1990 | Garza et al. | 430/312 |
| 5,126,231 A | * | 6/1992 | Levy | 430/313 |
| 5,160,404 A | * | 11/1992 | Motoyama | 438/694 |
| 5,314,772 A | * | 5/1994 | Kozicki et al. | 430/14 |
| 5,830,624 A | * | 11/1998 | Bae et al. | 430/323 |
| 5,989,788 A | * | 11/1999 | Bae et al. | 430/326 |
| 6,100,010 A | * | 8/2000 | Ina | 430/273.1 |
| 6,368,771 B1 | * | 4/2002 | Koh et al. | 430/270.1 |
| 6,514,672 B2 | * | 2/2003 | Young et al. | 430/314 |
| 6,589,707 B2 | * | 7/2003 | Lee et al. | 430/270.1 |

FOREIGN PATENT DOCUMENTS

| | | |
|---|---|---|
| JP | 3-126036 | 5/1991 |
| JP | 5-36599 | 2/1993 |
| JP | 5-94022 | 4/1993 |
| JP | 5-121312 | 5/1993 |
| JP | 10-268526 | 10/1998 |
| JP | 2000-68250 | 3/2000 |

* cited by examiner

Primary Examiner—Amanda Walke
(74) Attorney, Agent, or Firm—Westerman, Hattori, Daniels & Adrian, LLP

(57) ABSTRACT

There are provided steps of forming a lower resist layer on a patterning objective layer, forming an organic intermediate layer made of organic material, that contains no Si—O bond in its structure, on the lower resist layer, forming an upper resist layer made of alicyclic resin on the organic intermediate layer, forming a pattern by exposing/developing the upper resist layer, transferring the pattern of the upper resist layer onto the organic intermediate layer by etching the organic intermediate layer while using the upper resist layer as a mask, transferring a pattern of the organic intermediate layer onto the lower resist layer by etching the lower resist layer while using the organic intermediate layer as a mask, and etching the patterning objective layer while using the lower resist layer as a mask. Accordingly, a semiconductor device manufacturing method containing patterning steps employing a multi-layered resist structure, that is capable of suppressing deformation of the pattern of the upper resist layer formed of alicyclic compound, can be provided.

20 Claims, 3 Drawing Sheets

MULTI-LAYERED RESIST STRUCTURE AND MANUFACTURING METHOD OF SEMICONDUCTOR DEVICE

CROSS-REFERENCE TO RELATED APPLICATION

This application is based upon and claims priority of Japanese Patent Applications No. 2001-180584, filed in Jun. 14, 2001, the contents being incorporated herein by reference.

BACKGROUND OF THE INVENTION

1. Field of the Invention

The present invention relates to a multi-layered resist structure and a manufacturing method of a semiconductor device and, more particularly, a multi-layered resist structure employed to pattern the film and a manufacturing method of a semiconductor device comprising the patterning steps employing such multi-layered resist structure.

2. Description of the Prior Art

In the fabrication of the semiconductor device, there are contained the step of forming recess portions by patterning the silicon substrate, the step of forming electrodes by patterning the silicon film, etc. Such patterning is carried out by etching partially the silicon substrate, the silicon film, etc. while using the resist pattern as a mask.

However, since the resist pattern is formed to have a narrow width with the higher integration and the miniaturization of the semiconductor device, an aspect ratio that represents a ratio of a height to a width becomes large and then the resist pattern falls down, so that the pattern failure is ready to occur. Therefore, in order to reduce the aspect ratio, it is often tried that the resist pattern is formed thin. In this case, the thinning of the resist pattern has a limit with regard to the dry etching resistance.

For this reason, in order to prevent the falling-down of the resist pattern, it is effective to form the resist pattern as a triple-layered structure. The triple-layered structure of the resist pattern consists of a lower resist layer, an intermediate layer, and an upper resist layer. The intermediate layer is formed of the material that is different from the lower and upper resist layers.

For example, it is set forth in Patent Application Publication (KOKAI) Hei 3-126036 that the triple-layered structure constructed by putting the silylation product such as the serpentine, or the like between the resists for the g-line (wavelength 436 nm) exposure is employed. Also, the triple-layered structure in which the alkoxysilane/acrylic resin copolymer or SOG is employed as the intermediate layer and the DUV exposure material is employed as the upper resist layer is set forth in Patent Application Publication (KOKAI) Hei 5-94022. In addition, the triple-layered structure in which the amorphous silicon is employed as the intermediate layer and the X-ray exposure material is employed as the upper resist layer is set forth in Patent Application Publication (KOKAI) Hei 5-121312.

These resists of the triple-layered structure are patterned via steps of exposing/developing the upper resist layer to pattern it and then dry-etching the intermediate layer and the lower resist layer while using the pattern of the upper resist layer as a mask. Sometimes the upper resist layer is removed by the dry etching.

Also, the triple-layered structure in which the novolak type photoresist is employed as the lower resist layer, the silicon-containing negative type resist such as polyallylsilsesquioxane is employed as the intermediate layer, and the negative type resist is employed as the upper resist layer is set forth in Patent Application Publication (KOKAI) Hei 5-36599. In this case, the upper resist layer is patterned by exposing it by the DUV light and then developing it, then the intermediate layer is exposed by the ArF excimer laser while using the upper resist layer as a mask and then developed to form the pattern of the intermediate layer and remove the upper resist layer, and then the lower resist layer is dry-etched while using the intermediate layer as a mask, whereby the silicon-pattern forming mask is formed. Here the DUV light is a light having a wavelength of 230 to 300 nm.

Then, in order to miniaturize further the silicon pattern constituting the semiconductor device, the alicyclic resin that is exposed to the ArF excimer laser having a wavelength of 193 nm is employed as the upper resist layer of the triple-layered structure and also the SOG (Spin-On-Glass) is employed as the intermediate layer of the triple-layered structure. At that time, based on the experiment made by the inventors of the present invention, it becomes apparent that the deformation of the pattern of the upper resist layer easily occurs.

It may be considered as the cause of such deformation of the upper resist layer that the etching resistance of the material per se of the upper resist layer is not good in etching the intermediate layer and that the adhesiveness of the upper resist layer to the intermediate layer is not good.

SUMMARY OF THE INVENTION

It is an object of the present invention to provide a multi-layered resist structure capable of suppressing deformation of a pattern of an upper resist layer formed of alicyclic compound, and a semiconductor device manufacturing method employing such multi-layered resist structure.

According to the present invention, in the multi-layered resist, the silicon containing resin having no Si—O bond is employed as the material of the intermediate layer formed under the upper resist layer that is made of the alicyclic resin. In this case, the silicon atom contained in the silicon containing resin is bonded to any of carbon, silicon, and hydrogen.

Such intermediate layer has the good adhesiveness to the alicyclic resin, and also the upper resist layer is hard to peel off from the intermediate layer or to deviate from the intermediate layer even after the upper resist layer is patterned by exposing/developing it. As a result, the degradation of the patterning precision of the upper resist layer can be avoided Also, the etching resistance of the upper resist layer is good under the etching conditions employed when the intermediate layer is etched by using the pattern of the upper resist layer as a mask.

Accordingly, the shape of the resist pattern that is obtained by transferring the pattern of the upper resist layer onto the intermediate layer and then transferring the pattern of the intermediate layer onto the lower resist layer becomes good. Thus, the patterning precision of the film using such multi-layered resist can be increased.

DESCRIPTION OF THE PREFERRED EMBODIMENT

Therefore, an embodiment of the present invention will be explained with reference to the accompanying drawings hereinafter.

FIGS. 1A to 1H are sectional views showing film patterning steps according to an embodiment of the present invention.

Figure 1A:
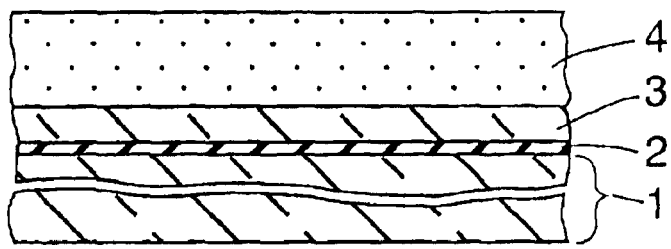
FIGS. 1A to 1H are sectional views showing film patterning steps according to an embodiment of the present invention.

First, as shown in FIG. 1A, a polycrystalline or amorphous silicon film (patterning objective layer) 3 of 0.2 μm thickness is formed on a silicon substrate 1 via an insulating film 2 formed of silicon oxide, silicon nitride, or the like. Then, a lower resist layer 4 is formed on the silicon film 3 by the spin coating to have a thickness of 0.3 to 1.0 μm, for example, 0.5 μm. Then, the lower resist layer 4 is pre-baked at 150° C. for 60 seconds in the nitrogen atmosphere or the air and then post-baked at 300° C. for 60 seconds.

As the lower resist layer 4, the KrF resist material exposed by the KrF excimer laser, e.g., polyvinylphenol resin is employed. As the KrF resist material formed of the polyvinylphenol resin, there is TDUR-P015 (product name) manufactured by the TOK Company.

Figure 1B:
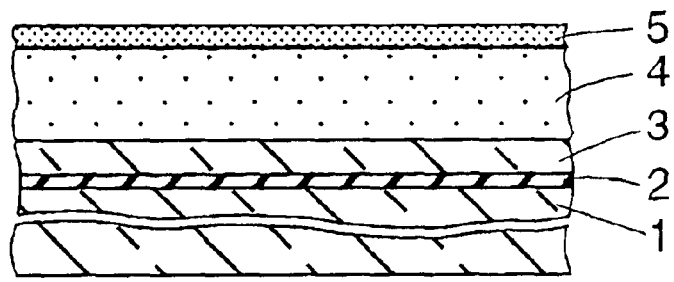

Then, as shown in FIG. 1B, an intermediate film 5 made of organic silicon is formed on the lower resist layer 4 by the spin coating to have a thickness of 0.15 μm. Then, the intermediate film 5 is baked at 150° C. for 60 seconds.

The organic silicon has no bond of the silicon (Si) atom and the oxygen (O) atom, and the silicon atom is bonded to at least any one of the carbon (C), the silicon (Si), and the hydrogen (H). As such organic silicon material, there is bis(trimethylsilylmethyl)citraconate-dimethylbenzyl methacrylate copolymer, for example. This bis(trimethylsilylmethyl)citraconate-dimethylbenzyl methacrylate copolymer has a structure whose copolymerization ratio of bis(trimethylsilylmethyl) citraconic acid and dimethylbenzyl methacrylate is 1:1 and has a silicon containing rate of 11%.

The bis(trimethylsilylmethyl)citraconate-dimethylbenzyl methacrylate copolymer is expressed by a following chemical formula. Here x and y denote a copolymerization ratio respectively and set to 1 in the present embodiment respectively.

(Formula 1)

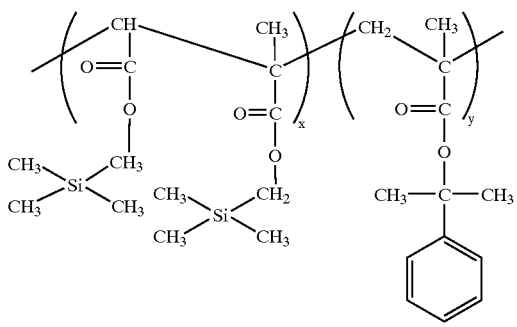

Figure 1C:
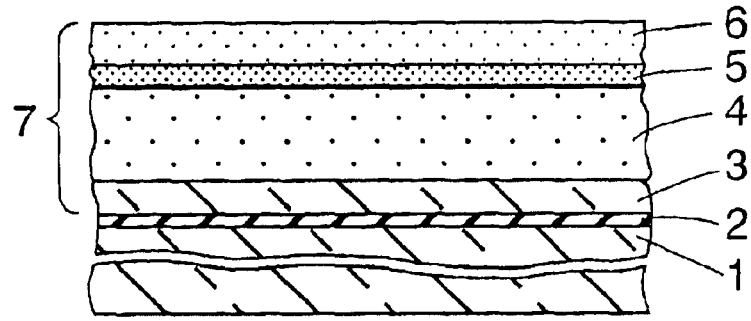

Then, as shown in FIG. 1C, an upper resist layer 6 made of the alicyclic resin that is exposed by the ArF excimer laser is formed on the intermediate layer 5 by the spin coating to have a thickness of 0.3 μm or less. As the ArF exposure resist, for example, there is PAR101 (product name) manufactured by Sumitomo Chemical Co.,Ltd.

Then, the upper resist layer 6 is baked at 120° C. for 60 seconds.

According to the above steps, the state that a triple-layered resist film 7 is formed on the silicon film 3 is brought about.

Figure 1D:
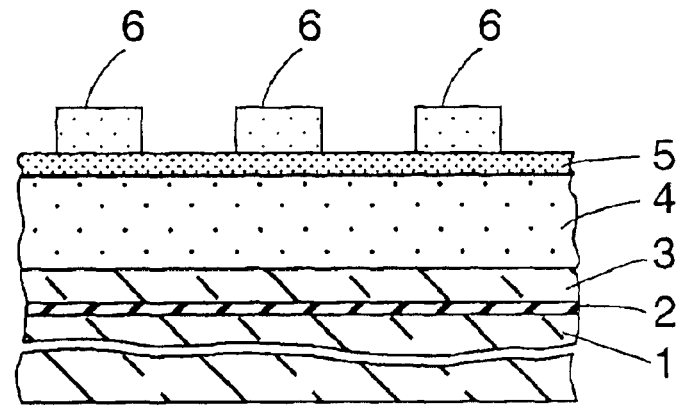

Then, as shown in FIG. 1D, a line & space latent image, for example, is formed by exposing the upper resist layer 6 by virtue of the contracting projection exposure method, the reflecting projection exposure method, etc. Then, the upper resist layer 6 is developed by using 2.38% TMAH (trimethylammonium hydroxide). As a result, the upper resist layer 6 has the line & space pattern shape having a pitch of 0.13 μm, for example.

Figure 1E:
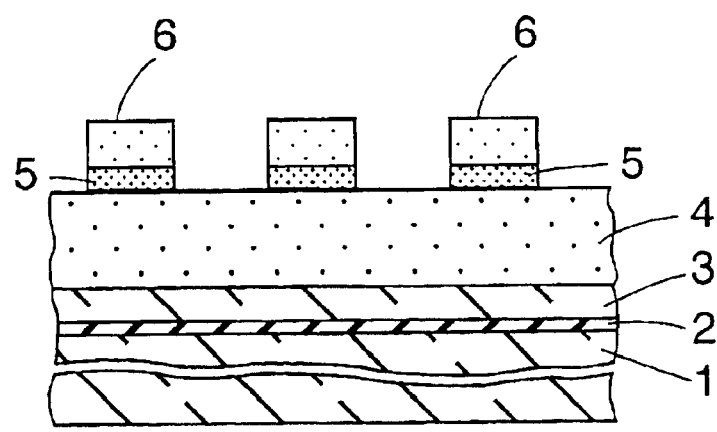

Then, as shown in FIG. 1E, the pattern of the upper resist layer 6 is transferred onto the intermediate layer 5 by dry-etching the intermediate layer 5 while using the chlorine ($Cl_2$) or the hydrogen bromide (HBr) as the etching gas and using the upper resist layer 6 as a mask. Thus, the intermediate layer 5 is formed as the line & space pattern shape. The etching resistance of the alicyclic resin to such etching gas is good.

Figure 1F:
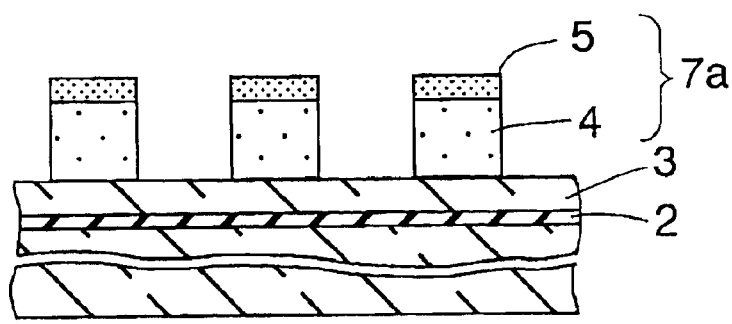

Then, as shown in FIG. 1F, the line & space pattern of the intermediate layer 5 is transferred onto the lower resist layer 4 by dry-etching the lower resist layer 4 while using the intermediate layer 5 as a mask and using the oxygen ($O_2$)/sulfur oxide ($SO_2$) mixed gas or the oxygen gas as the etching gas. In this case, if the upper resist layer 6 still remains on the intermediate layer 5, such upper resist layer 6 is removed by the etching. At this time, in some case a thickness of the intermediate layer 5 is reduced by the etching.

Accordingly, the state that a double-layered resist pattern 7a consisting of the lower resist layer 4 and the intermediate layer 5 is formed on the silicon layer 3 is brought about at a point of time when the patterning of the lower resist layer 4 is finished.

Figure 1G:
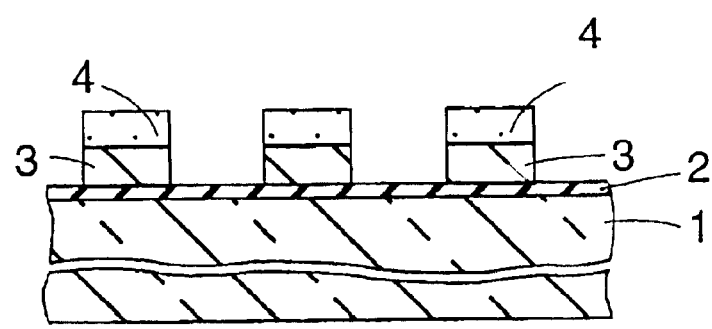

Then, as shown in FIG. 1G, if the silicon layer 3 is etched by using the chlorine or the hydrogen bromide as the etching gas and using the resist pattern 7a as a mask, the shape of the resist pattern 7a is transferred onto the silicon layer 3 to form the line & space pattern.

Figure 1H:
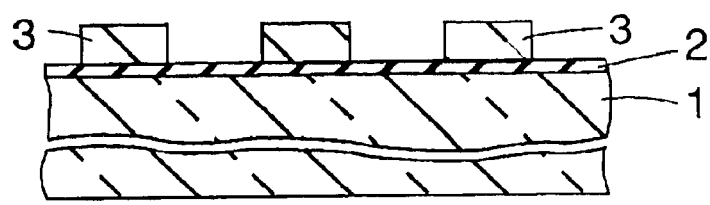

Then, as shown in FIG. 1H, the lower resist layer 4 is ashed by using the oxygen ($O_2$)/sulfur oxide ($SO_2$) mixed gas or the oxygen gas as the etching gas to remove from the surface of the silicon layer 3

With the above, the patterning steps of the silicon layer 3 are finished. The patterning of the silicon layer 3 is employed to form the gate electrodes, the wirings, the active layers of the thin film transistor, the holes, etc. Also, in case the concave portions are formed by etching the silicon substrate, the above triple-layered resist film 7 may be employed.

In the above embodiment, as the intermediate layer 5 of the triple-layered resist film 7, the material which contains no silicon-oxygen bond (Si—O) molecule in the molecular structure and is difficult to be dissolved by the developer of the upper resist layer 6 is employed.

Like the prior art, if the alicyclic resist is coated as the upper resist layer on the intermediate layer formed of the material having the Si—O bond, the adhesiveness of the alicyclic resist to the intermediate layer is lowered extremely and peeled off rather than the aromatic resist or the alicyclic resist is deformed easily by the developing. As the material having the Si—O bond, there are present not only inorganic materials such as SOG, silicon oxide film, silicon nitride oxide, etc. but also organic materials such as alkoxysilane/ acrylic resin copolymer, clay mineral silylate, polyalylsilsesquioxane, etc.

The etching resistance of the resist made of polyvinylphenol, novolak resin is not good when the intermediate layer having the Si—O bond is etched and also the adhesiveness of such resist to the intermediate layer having the Si—O bond is not good, but both are not so bad as the alicyclic resin.

If the organic silicon resin having no Si—O bond is applied as the intermediate layer, the etching resistance of the upper resist made of the resin material except the alicyclic resin can be improved when such intermediate layer is etched, and also the adhesiveness of the upper resist to such intermediate layer can be improved.

Figure 2:
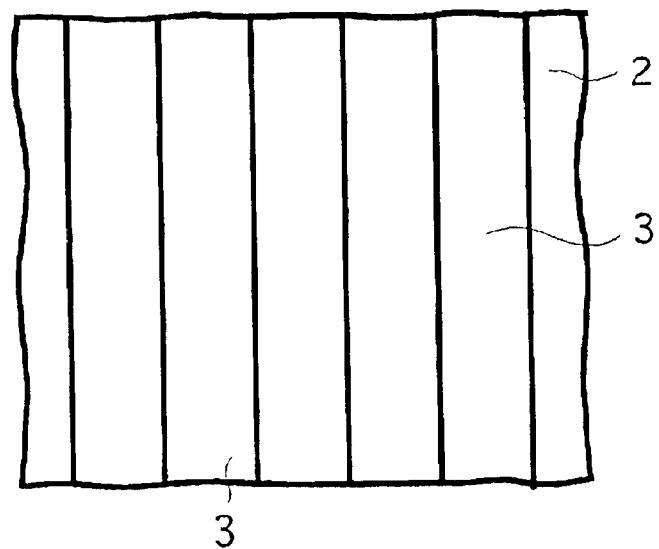
FIG. 2 is a plan view showing a pattern of a silicon film formed by a film patterning method according to the embodiment of the present invention.
Figure 3:
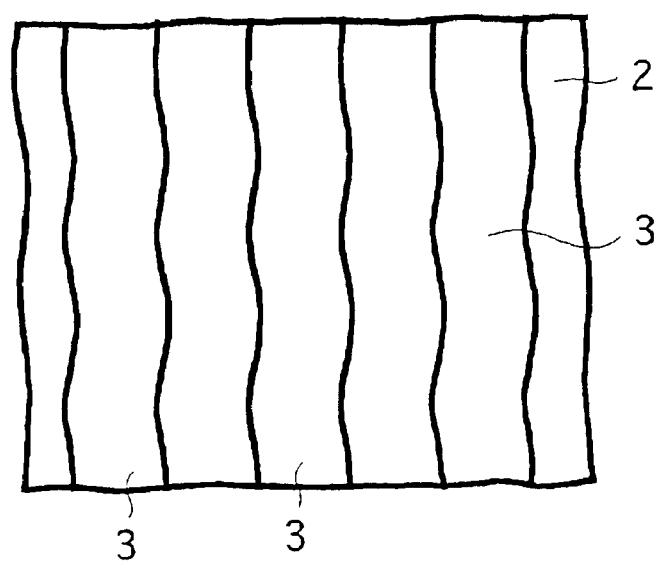
FIG. 3 is a plan view showing a pattern of a silicon film formed by the film patterning method in the prior art.

Like the present embodiment, when the intermediate layer 5 is constructed by the organic silicon having no Si—O bond and then the intermediate layer 5 is etched by using the pattern of the upper resist layer 6 made of the ArF photoresist as a mask, the deformation of the intermediate layer 5 seldom occurs. For instance, after the line & space pattern of the upper resist layer 6 is transferred onto the intermediate layer 5, the lower resist layer 4 and the silicon film 3, the good pattern of the silicon film 3 can be obtained, as shown in a plan view of FIG. 2. In contrast, if SOG is employed as the intermediate layer formed under the upper resist layer made of the alicyclic resin, the shape of the patterned silicon film 3 is degraded, as shown in FIG. 3.

Also, in the above embodiment, since only the upper resist layer 6 out of the lower resist layer 4, the intermediate layer 5 and the upper resist layer 6 is subjected to the wet process but the intermediate layer 5 and the lower resist layer 4 are subjected to the dry process, a possibility of the falling-down of the resist pattern by the wet process can be substantially eliminated. In addition, since the silicon-containing intermediate layer 5 is etched simultaneously with the etching of the silicon layer 3, it is easy to remove the resist only by the ashing of the lower resist layer 4.

In the above embodiment, the material that is exposed by the KrF excimer laser is selected as the lower resist layer 4, but resist material that can be exposed by the i-line or g-line light may be selected. As the i-line exposure resist material, there is the novolak resin such as PFI-38 (product name) manufactured by Sumitomo Chemical Co., Ltd., for example. The lower resist layer 4 formed of such material may also be etched while using the intermediate layer 5 as a mask and using the $O_2SO_2$ mixed gas or the oxygen gas as the etching gas.

When the i-line exposure resist whose thickness is set to 0.2 μm that is equal to the silicon layer is employed as the lower resist layer 4 and then the silicon layer 3 is etched while using the intermediate layer 5 and the lower resist layer 4 as a mask, the lower resist layer 4 disappears although the etching of the silicon layer 3 is not completed, so that it is impossible to continue the patterning of the silicon layer 3. In this case, the silicon layer 3 still remains under the lower resist layer 4 by about 50 nm.

It is preferable from this fact that a thickness of the lower resist layer 4 should be set thicker than a target etching depth of the silicon layer 3.

As the alicyclic resin constituting the upper resist layer 6, there is the copolymer resin containing any one of 2-methyl adamantyl methacrylate, 2-methyl adamantyl acrylate, 2-ethyl adamantyl methacrylate, 2-ethyl adamantyl acrylate, 2-γ-butyl lactone methacrylate, γ-butyl lactone acrylate, mevalonic lactone methacrylate, mevalonic lactone acrylate, adamantanol methacrylate, adamantanol acrylate, HGB methacrylate, and HGB acrylate as the monomer. But the alicyclic resin is not limited to them.

Also, as the silicon-containing organic material constituting the organic intermediate layer 5 and containing no Si—O bond, there is the polymer or the copolymer or their mixture of the materials listed in the following. But the organic material is not limited to them.

The materials are bis(trimethylsilylmethyl) citraconate, (3-acroxypropyl)methyldichlorosilane, acroxytrimetylsilane, methacryloamidetrimethylsilane, (methacroxymethyl)phenyldimethylsilane, methacrylomethylsilane, methyl(1-trimethylsilylacrylate), trimethylsilylmethylacrylate and α-substitution acrylate, trimethylsilyl methyl itaconate, tri(trimethylsilyl) silylethylacrylate and α-substitutionacrylate, 2-trimetylsilylpropylacrylate and α-substitutionacrylate, allylphenyldichlorosilane, p-trimethylsilyl styrene, allyltrimethylsilane, 5-(bicycloheptenyl)trichlorosilane, bromovinyltrimethylsilane, 3-cyclohexenyltrichlorosilane, cyclopentadienyltrimethylsilane, (2-methylpropenyl) trimethylsilane, (2,4-pentadienyl)trimethylsilane, 2-propenyltrimethylsilane, 3-(trimethylsilyl)cyclopentene, trivinylmethylsilane, 2-trimethylsilylpropyloxycarboxylnorbornene, ethynyl trimethylsilane, methyltrimethylsilylethynylketone, phenylethynyltrimethylsilane, 1-trimethylsilyl-1-hexyne, 1,1,3,3,5,5-hexamethyl cyclotrisilazane, 1,3,5-trivinyl-1,3, 5-trimethylcyclotrisilazane, trimethylsilylmaleimide, butyldimethylsilylmaleimide, etc.

In this case, it is preferable that, in order to optimize the selective ratio to the lower resist layer 4, the silicon containing ratio of the intermediate layer 5 should be set to 5 wt % to 15 wt %.

Also, in the case that the Si—O bond is present on the surface of the patterning objective layer 3, it is not preferable to employ the alicyclic resist material as the lower resist layer 4 if the adhesiveness to the patterning objective layer 3 is taken account of. It is preferable to employ the aromatic resin, the polyvinylphenol resin, the novolak resin, etc., for example. As the patterning objective layer on the surface of which such Si—O bond appears, there are the SOG film, the silicon oxide film, the silicon nitride oxide film, the natural oxide film, the film obtained by doping the impurity into one of those films, etc.

In addition, in the above embodiment, the ArF eximer laser is employed as the exposure light for the upper resist layer 6. In this case, if the upper resist layer is formed of the alicyclic resin material that employs the $F_2$ laser, or the like, that emits the light having the shorter wavelength, e.g., the vacuum deep ultraviolet ray, as the exposure light instead to the ArF eximer laser, the similar advantages to the above can be achieved.

As described above, according to the present invention, in the multi-layered resist, the silicon containing resin having no Si—O bond is employed as the material of the intermediate layer formed under the upper resist layer made of the alicyclic resin. Therefore, such intermediate layer has the good adhesiveness to the alicyclic resin, and also the upper resist layer is hard to peel off from the intermediate layer or to deviate from the intermediate layer even after the upper resist layer is patterned by exposing/developing. As a result, the degradation of the patterning precision of the upper resist layer can be avoided, and thus the patterning precision of the film using such multi-layered resist can be increased.

The embodiment explains a semiconductor device manufacturing method employing a multi-layered resist structure of the present invention.

But it is not limited to a semiconductor device manufacturing method. It is available to a Liquid Crystal Device or Plasma Display Panel Device or Magnetic head manufacturing method and the like.

What is claimed is:

1. A semiconductor device manufacturing method comprising the steps of:

forming a lower resist layer on a patterning objective layer;

forming an organic intermediate layer made of organic silicon-containing material, having no Si—O bond in its structure, on the lower resist layer;

forming an upper resist layer made of alicyclic resin on the organic intermediate layer;

forming a pattern by exposing/developing the upper resist layer;

transferring the pattern of the upper resist layer onto the organic intermediate layer by etching the organic intermediate layer selectively with respect to the lower layer while using the upper resist layer as a mask;

transferring a pattern of the organic intermediate layer onto the lower resist layer by etching the lower resist layer while using the organic intermediate layer as a mask; and patterning the patterning objective layer by etching the patterning objective layer while using the lower resist layer and the organic intermediate layer as a mask.

2. A semiconductor device manufacturing method comprising the steps of:

forming a lower resist layer on a patterning objective layer;

forming an organic intermediate layer made of organic silicon-containing material, having no Si—O bond in its structure, on the lower resist layer;

forming an upper resist layer made of alicyclic resin on the organic intermediate layer;

forming a pattern by exposing/developing the upper resist layer;

transferring the pattern of the upper resist layer onto the organic intermediate layer by etching the organic intermediate layer while using the upper resist layer as a mask;

transferring a pattern of the organic intermediate layer onto the lower resist layer by etching the lower resist layer while using the organic intermediate layer as a mask; and patterning the patterning objective layer by etching the patterning objective layer while using the lower resist layer and the organic intermediate layer as a mask, and the organic intermediate layer is etched simultaneously with etching of the patterning object layer.

3. A semiconductor device manufacturing method comprising the steps of:

forming a lower resist layer on a patterning objective layer;

forming an organic intermediate layer made of organic silicon-containing material, having no Si—O bond in its structure, on the lower resist layer;

forming an upper resist layer made of alicyclic resin on the organic intermediate layer;

forming a pattern by exposing/developing the upper resist layer;

transferring the pattern of the upper resist layer onto the organic intermediate layer by etching the organic intermediate layer while using the upper resist layer as a mask;

transferring a pattern of the organic intermediate layer onto the lower resist layer by etching the lower resist layer while using the organic intermediate layer as a mask, and simultaneously the upper resist layer is etched and removed; and patterning the patterning objective layer by etching the patterning objective layer while using the lower resist layer and the organic intermediate layer as a mask.

4. A semiconductor device manufacturing method comprising the steps of:

forming a lower resist layer on a patterning objective layer, the lower resist layer which is thicker than a thickness of the patterning objective layer;

forming an organic intermediate layer made of organic silicon-containing material, having no Si—O bond in its structure, on the lower resist layer;

forming an upper resist layer made of alicyclic resin on the organic intermediate layer;

forming a pattern by exposing/developing the upper resist layer;

transferring the pattern of the upper resist layer onto the organic intermediate layer by etching the organic intermediate layer while using the upper resist layer as a mask;

transferring a pattern of the organic intermediate layer onto the lower resist layer by etching the lower resist layer while using the organic intermediate layer as a mask; and patterning the patterning objective layer by etching the patterning objective layer while using the lower resist layer and the organic intermediate layer as a mask.

5. A semiconductor device manufacturing method according to claim 1, wherein silicon contained in the organic intermediate layer is bonded only to at least one of hydrogen, carbon, and silicon.

6. A semiconductor device manufacturing method according to claim 2, wherein silicon contained in the organic intermediate layer is bonded only to at least one of hydrogen, carbon, and silicon.

7. A semiconductor device manufacturing method according to claim 3, wherein silicon contained in the organic intermediate layer is bonded only to at least one of hydrogen, carbon, and silicon.

8. A semiconductor device manufacturing method according to claim 4, wherein silicon contained in the organic intermediate layer is bonded only to at least one of hydrogen, carbon, and silicon.

9. A semiconductor device manufacturing method according to claim 1, wherein the upper resist is exposed by an ArF excimer laser.

10. A semiconductor device manufacturing method according to claim 2, wherein the upper resist is exposed by an ArF excimer laser.

11. A semiconductor device manufacturing method according to claim 3, wherein the upper resist is exposed by an ArF excimer laser.

12. A semiconductor device manufacturing method according to claim 4, wherein the upper resist is exposed by an ArF excimer laser.

13. A semiconductor device manufacturing method according to claim 1, wherein the patterning objective layer is formed of a silicon layer, a silicon oxide layer, or silicon nitride layer.

14. A semiconductor device manufacturing method according to claim 2, wherein the patterning objective layer is formed of a silicon layer, a silicon oxide layer, or silicon nitride layer.

15. A semiconductor device manufacturing method according to claim 3, wherein the patterning objective layer is formed of a silicon layer, a silicon oxide layer, or silicon nitride layer.

16. A semiconductor device manufacturing method according to claim 4, wherein the patterning objective layer is formed of a silicon layer, a silicon oxide layer, or silicon nitride layer.

17. A semiconductor device manufacturing method according to claim 1, wherein the patterning objective layer is a layer on a surface of which an Si—O bond is present, and the lower resist layer is formed of one of aromatic resin, polyvinylphenol resin, and novolac resin.

18. A semiconductor device manufacturing method according to claim 2, wherein the patterning objective layer is a layer on a surface of which as Si—O bond is present, and the lower resist layer is formed of one of aromatic resin, polyvinylphenol resin and novolac resin.

19. A semiconductor device manufacturing method according to claim 3, wherein the patterning objective layer is a layer on a surface of which an Si—O bond is present, and the lower resist layer is formed of one of aromatic resin, polyvinylphenol resin, and novolac resin.

20. A semiconductor device manufacturing method according to claim 4, wherein the patterning objective layer is a layer on a surface of which an Si—O bond is present, and the lower resist layer is formed of one of aromatic resin, polyvinylphenol resin, and novolac resin.

* * * * *